United States Patent
Funakubo et al.

(10) Patent No.: US 10,861,675 B2
(45) Date of Patent: Dec. 8, 2020

(54) PLASMA PROCESSING APPARATUS AND PLASMA PROCESSING METHOD

(71) Applicant: TOKYO ELECTRON LIMITED, Tokyo (JP)

(72) Inventors: Takao Funakubo, Miyagi (JP); Hirofumi Haga, Miyagi (JP); Shinichi Kozuka, Miyagi (JP); Wataru Ozawa, Miyagi (JP); Akihiro Sakamoto, Miyagi (JP); Naoki Taniguchi, Miyagi (JP); Hiroshi Tsujimoto, Miyagi (JP); Kumiko Ono, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 40 days.

(21) Appl. No.: 16/239,756

(22) Filed: Jan. 4, 2019

(65) Prior Publication Data

US 2019/0139744 A1    May 9, 2019

Related U.S. Application Data

(63) Continuation of application No. 14/751,655, filed on Jun. 26, 2015, now Pat. No. 10,204,763.

(30) Foreign Application Priority Data

Jun. 30, 2014  (JP) .................. 2014-134500
Sep. 12, 2014  (JP) .................. 2014-186820

(51) Int. Cl.
  *H01J 37/32*   (2006.01)

(52) U.S. Cl.
  CPC .... *H01J 37/32082* (2013.01); *H01J 37/3299* (2013.01); *H01J 37/32174* (2013.01); *H01J 37/32449* (2013.01); *H01J 37/32834* (2013.01)

(58) Field of Classification Search
  CPC .......... H01L 21/67069; H01J 37/32449; H01J 37/32834; H01J 37/32082; H01J 37/32174; H01J 37/3299
  See application file for complete search history.

(56) References Cited

U.S. PATENT DOCUMENTS

2006/0032443 A1   2/2006  Hasebe et al.

FOREIGN PATENT DOCUMENTS

| CN | 1881541 A | 12/2006 |
| CN | 101416284 A | 4/2009 |
| CN | 101523570 A | 9/2009 |
| CN | 102810445 A | 12/2012 |
| JP | 7-130495 A | 5/1995 |
| JP | 2002-297244 A | 10/2002 |
| JP | 2006-24775 A | 1/2006 |
| JP | 2007-35929 A | 2/2007 |

*Primary Examiner* — Yuechuan Yu
(74) *Attorney, Agent, or Firm* — Rothwell, Figg, Ernst & Manbeck P.C.

(57) ABSTRACT

A controller disclosed herein drives, in a first step, a high frequency generating source at a first energy condition, and drives, in a second step, a high frequency generating source at a second energy condition. Prior to a switching time of the first step and the second step, the controller switches gas species supplied from the gas supply system into the processing container, and sets a gas flow rate in an initial period just after the switching to be larger than a gas flow rate in a stabilization period after lapse of the initial period.

3 Claims, 12 Drawing Sheets

| APC Opening Angle (°) | Pressure (mTorr) | | |
|---|---|---|---|
| | 40 | 100 | 190 |
| Flow Rate 100 | 5.4 | 2.0 | |
| Flow Rate 400 | 8.6 | 6.0 | 4.5 |
| Flow Rate 700 | 10.8 | 7.2 | 5.7 |
| Flow Rate 1000 | 12.8 | 8.2 | 6.4 |
| Flow Rate 1300 | 15.2 | 9.0 | 7.0 |

| Conductance | Pressure (mTorr) | | |
|---|---|---|---|
| | 40 | 100 | 190 |
| Flow Rate 100 | 2.5 | 1.0 | 0.5 |
| Flow Rate 400 | 10.0 | 4.0 | 2.1 |
| Flow Rate 700 | 17.5 | 7.0 | 3.7 |
| Flow Rate 1000 | 25.0 | 10.0 | 5.3 |
| Flow Rate 1300 | 32.5 | 13.0 | 6.8 |

Example

Comparative Example

PLASMA PROCESSING APPARATUS AND PLASMA PROCESSING METHOD

CROSS-REFERENCE TO RELATED APPLICATIONS

This application is a continuation of U.S. patent application Ser. No. 14/751,655, filed on Jun. 26, 2015, and claims priority from Japanese Patent Application Nos. 2014-134500 and 2014-186820, filed on Jun. 30, 2014 and Sep. 12, 2014, respectively. The benefit of priority is claimed to each of the foregoing, and the entire contents of each of the foregoing are incorporated herein by reference.

TECHNICAL FIELD

Various Aspects of the present disclosure are related to a plasma processing apparatus and a plasma processing method.

BACKGROUND

Conventionally, a dipole ring magnet (DRM) type plasma processing apparatus has been known as an apparatus that performs a plasma processing such as, for example, a film-forming process or an etching process. The DRM type plasma processing apparatus includes a processing container that accommodates a semiconductor wafer, and a plurality of cylindrical magnets arranged annularly around the processing container and each erectly provided to be point-symmetrically paired. The plurality of cylindrical magnets are rotatably connected to a rotary driving mechanism. When each cylindrical magnet (segment magnet) is rotated 180 degrees, a magnetization direction is rotated (reversely rotated) one revolution. In addition, the DRM type plasma processing apparatus synchronously rotates the plurality of cylindrical magnets so as to apply a horizontal magnetic field within the processing container, and to perform a plasma processing on a semiconductor wafer horizontally mounted on a mounting table within the processing container (see, e.g., Japanese Patent Laid-Open Publication No. H7-130495 and Japanese Patent Laid-Open Publication No. 2006-24775).

In such a DRM type plasma processing apparatus, multiple kinds of plasma processings are performed in time series. When respective plasma processings are switched, the kinds of processing gases and set values of an RF high frequency generating source are switched. This is because, for example, the gas species and the set values of the RF high frequency generating source (frequencies and powers) required by a plasma processing process for etching an anti-reflection film containing Si (Si-ARC) and a plasma processing process for etching amorphous carbon are different from each other.

In other words, in the conventional plasma processing apparatus, since plasma is extinguished at the time of terminating a first step, particles may be deposited on a substrate, causing a device failure. Recently, a device maker has applied a technique for suppressing the device failure caused by the deposition of particles by continuously generating plasma so as to maintain a plasma sheath on a substrate. For example, as an exemplary embodiment, the plasma processing apparatus includes a processing container, a gas supply system configured to supply a gas into the processing container, a high frequency generating source configured to introduce high frequency waves for plasma generation into the processing container, and a controller configured to control the gas supply system and the high frequency generating source. In a first step, the controller drives the high frequency generating source at a first energy condition, and in a second step, the controller drives the high frequency generating source at a second energy condition. In addition, it is also known that the plasma is continuously generated even before and after the switching of the conditions.

SUMMARY

According to an aspect of the present disclosure, a plasma processing apparatus includes: a processing container; a gas supply system configured to supply a gas into the processing container; a high frequency generating source configured to introduce high frequency waves for plasma generation into the processing container; and a controller configured to control the gas supply system and the exhaust efficiency adjusting unit. In a first step, the controller drives the high frequency generating source at a first energy condition, and in a second step, the controller drives the high frequency generating source at a second energy condition. Prior to a switching time of the first step and the second step, the controller switches gas species supplied from the gas supply system into the processing container, and sets a gas flow rate in an initial period just after the switching to be larger than a gas flow rate in a stabilization period after the lapse of the initial period.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
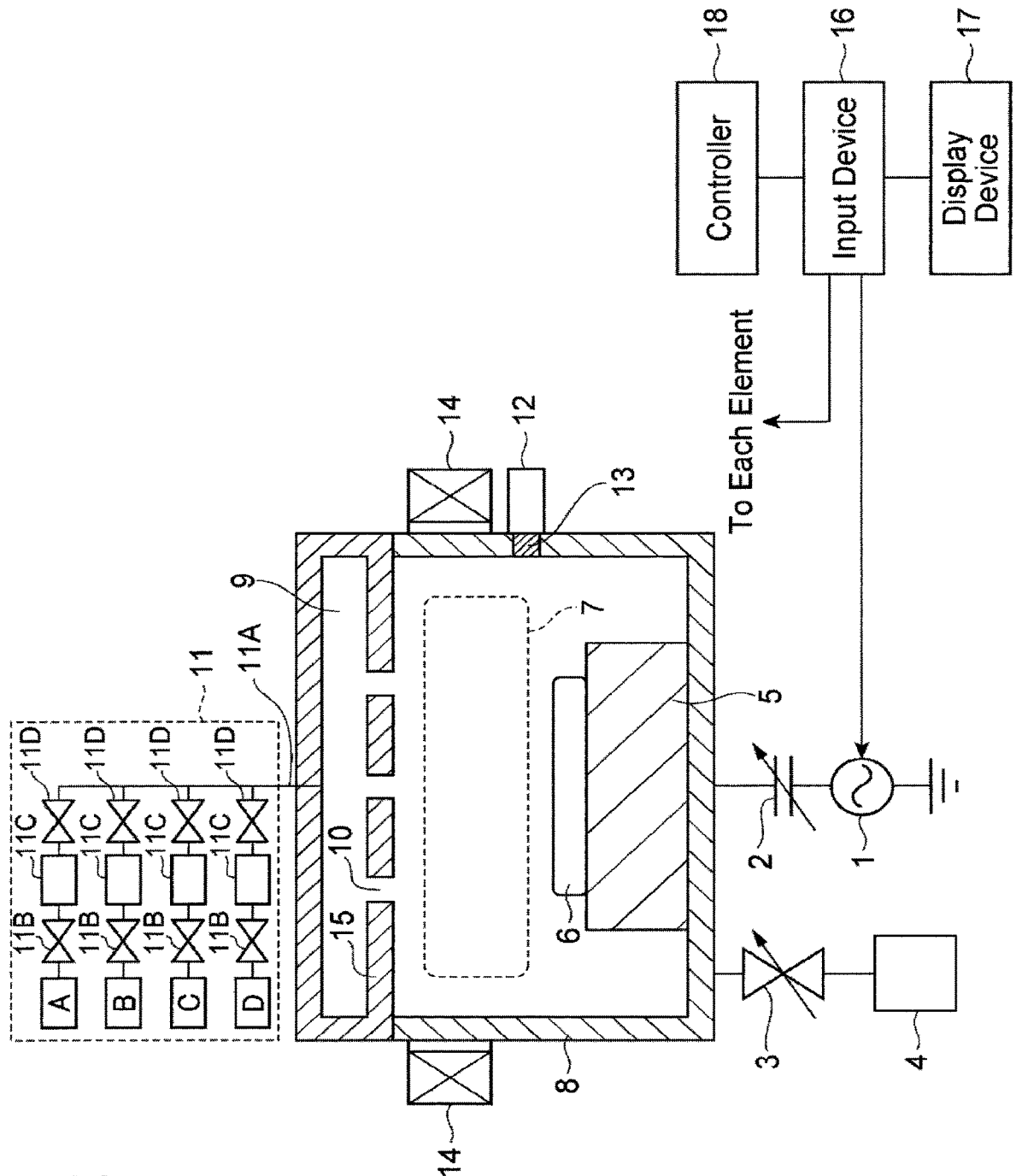
FIG. 1 illustrates a constitution of a plasma processing apparatus.

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

When switching from the first step to the second step is carried out, there is a problem in that it takes a long time for the plasma to achieve a stabilization period. When the plasma is not stabilized, it becomes impossible to perform a proper processing. The present disclosure has been made in consideration of this problem, and an object of the present disclosure is to provide a plasma processing apparatus and a plasma processing method capable of quickly stabilizing plasma after switching of steps so as to enable a proper plasma processing.

In order to solve the problems described above, a first plasma processing apparatus according to an aspect of the present disclosure includes: a processing container; a gas supply system configured to supply a gas into the processing container; a high frequency generating source configured to introduce high frequency waves for plasma generation into the processing container; and a controller configured to control the gas supply system and the high frequency generating source. In a first step, the controller drives the high frequency generating source at a first energy condition, and in a second step, the controller drives the high frequency generating source at a second energy condition. Prior to a switching time of the first step and the second step, the controller switches gas species supplied from the gas supply system into the processing container, and sets a gas flow rate in an initial period just after the switching to be larger than a gas flow rate in a stabilization period after the lapse of the initial period.

In the plasma processing apparatus, by switching gas species earlier than the switching time of the energy conditions of the high frequency generating source and increasing the gas flow rate, the gas of the first step within the processing container may be quickly exhausted, the uniformity of the gas within the processing container may be improved, the pressure may be stabilized, and the stabilization period in which the plasma is stabilized may be quickly achieved.

A second plasma processing apparatus according to an aspect of the present disclosure further including an exhaust efficiency adjusting unit configured to adjust exhaust efficiency of the gas within the processing container. The controller controls the exhaust efficiency adjusting unit such that, in the initial period, the exhaust efficiency of the gas within the processing container is increased to be higher than the exhaust efficiency of the gas in the stabilization period.

As described above, when the gas flow rate is greatly increased earlier than the switching of the energy conditions, the internal pressure may be irregularly fluctuated. However, the fluctuation of the pressure may be suppressed by increasing the exhaust efficiency.

A first plasma processing method according to an aspect of the present disclosure uses a plasma processing apparatus including a processing container, a gas supply system configured to supply a gas into the processing container, a high frequency generating source configured to introduce high frequency waves for plasma generation into the processing container, and a controller configured to control the gas supply system and the high frequency generating source. The plasma processing method includes: a first step of driving the high frequency generating source at a first energy condition; and a second step of driving the high frequency generating source at a second energy condition. Prior to a switching time of the first step and the second step, gas species supplied from the gas supply system into the processing container are switched, and a gas flow rate in an initial period just after the switching is set to be larger than a gas flow rate in a stabilization period after the lapse of the initial period.

As in the case of the apparatus described above, by switching gas species earlier than the switching time of the energy conditions of the high frequency generating source and increasing the gas flow rate, the gas of the first step within the processing container may be quickly exhausted, the uniformity of the gas within the processing container may be improved, the pressure may be stabilized, and the stabilization period in which the plasma is stabilized may be quickly achieved.

In a second plasma processing method according to an aspect of the present disclosure, in the initial period, the exhaust efficiency of the gas within the processing container is increased to be higher than the exhaust efficiency of the gas in the stabilization period.

As in the case of the apparatus described above, when the gas flow rate is greatly increased earlier than the switching of the energy conditions, the internal pressure may be irregularly fluctuated. However, the fluctuation of the pressure may be suppressed by increasing the exhaust efficiency.

In addition, a plasma processing apparatus according to an aspect of the present disclosure includes: a processing container; a gas supply system configured to supply a gas into the processing container; a high frequency generating source configured to introduce high frequency waves for plasma generation into the processing container; an exhaust efficiency adjusting unit configured to adjusting exhaust efficiency of the gas within the processing container; and a controller configured to control the gas supply system and the exhaust efficiency adjusting unit. In a case where set pressures within the processing container in first and second steps executed within the processing container are different from each other, the controller sets, based on a set pressure within the processing container in the second step and a set flow rate of the gas supplied from the gas supply system, a target value of exhaust efficiency of the exhaust efficiency adjusting unit which has a correlation with values of the set pressure and the set flow rate, and controls the exhaust efficiency adjusting unit such that an actual exhaust efficiency becomes the target value of the exhaust efficiency.

Because the target value of the exhaust efficiency is calculated in advance based on the set pressure and the set flow rate having the correlation with the target value, it is possible to make the pressure within the processing pressure quickly coincide with the target value so as to stabilize the pressure and the plasma state within the processing container.

According to the present disclosure, it becomes possible to shorten a gas transition state time that always occurs at the time of transition from the plasma of the first step to the plasma of the second step, and hence to shorten the time required for the plasma to reach the stabilized state. That is, as a result of making an improvement to shorten the plasma transition state, even in a continuous discharge processing (continuous plasma) for particle reduction, it becomes possible to obtain plasma processing results more similar to those obtained by an intermittent discharge processing. In addition, with respect to a plasma etching film in a device, it becomes possible to perform a more suitable plasma processing on the device by providing a plasma processing in which a gas delay by hardware is taken into consideration. Thus, according to the present disclosure, since the stabilization period in which the plasma is stabilized may be quickly achieved, a suitable plasma processing may be performed.

Hereinafter, descriptions will be made on a plasma processing apparatus and a plasma processing method. Similar elements will be denoted by similar symbols and repeated descriptions will be omitted.

FIG. 1 is a view illustrating a constitution of a plasma processing apparatus.

The plasma processing apparatus includes a processing container 8, a gas supply system 11 configured to supply a gas into the processing container 8, a high frequency generating source 1 configured to introduce high frequency waves for plasma generation into the processing container 8, and a conductance-variable automatic pressure control valve (APC) 3 (exhaust efficiency adjusting unit) configured to adjust the exhaust efficiency of the gas within the processing container 8. The APC 3 is connected to an exhaust apparatus 4 such as, for example, a turbo molecular pump, and the exhaust apparatus 4 exhausts the gas within the processing container 8 via the APC 3.

Within the processing container 8, a sample table 5 is provided so as to place a sample 6 such as, for example, a substrate, thereon, and plasma 7 is generated at the upper side of the sample table 5. The plasma 7 is RF magnetron plasma, and a gas is supplied from the gas supply system 11 to the space for generating the plasma 7 via a gas diffusion space 9 and gas inlet holes 10. To the supplied gas, high frequency waves are imparted from the high frequency generating source 1 and a magnetic field is applied from a magnet so as to generate the plasma. The sample 6 is processed by the generated plasma.

In addition, the magnet 14 includes a plurality of cylindrical magnets arranged annularly around the processing container 8 and each installed in a standing manner to form point-symmetrically pairs, and the plurality of cylindrical magnets are connected to a rotary driving mechanism to be synchronously rotatable, thereby forming a DRM type plasma apparatus.

The plasma 7 generated within the processing container 8 is observed by a monitor device 12 through a quartz window 13 provided on an outer wall of the processing container 8. The monitor device 12 may employ, for example, a spectroscopic analyzer that separates and observes the light output from the plasma for each wavelength. By performing a spectral analysis with the spectroscopic analyzer, components corresponding spectrums may be specified.

Within the gas supply system 11, multiple kinds of gases are prepared in supply systems. The gas supply system 11 may supply, for example, four kinds of gases A, B, C, and D accumulated in gas sources to a gas pipe 11A through front stage valves 11B, flow rate controllers 11C, and rear stage valves 11D, respectively. Each flow rate controller 11C refers to a device for controlling a flow rate of a gas flowing therethrough, for example, a mass flow rate controller (MFC) or a flow control system (FCS). The gas pipe 11A is connected to the gas diffusion space 9 of the processing container 8. The gases are introduced into the gas diffusion space 9 provided in the upper portion of the processing container 8. The bottom portion 15 of the gas diffusion space 9) is fixed to a ground potential, and a plurality of gas inlet holes 10 are formed in the bottom portion 15. A high frequency voltage for plasma generation is applied between the bottom portion 15 and the high frequency generating source 1.

A high frequency (RF) generating source typically has an output impedance of 50Ω. However, the impedance of plasma is changed depending on the state of the plasma. Thus, when high frequency (RF) waves are supplied to a plasma load as it is, the high frequency waves are reflected. An RF matcher may perform impedance matching depending on the change of the plasma impedance. That is, a matcher 2 is provided between the high frequency generating source 1 and the sample table 5 to automatically perform the impedance matching therebetween. The matcher 2 is constituted with one pair of variable capacitors, and performs the impedance matching to reduce the reflected waves from the processing container 8 by adjusting the values of the capacitors. In addition, although the matcher 2 includes one pair of capacitors C1 and C2, the matcher 2 may function even with one capacitor.

By generating plasma efficiently, the present plasma processing apparatus may function as a plasma processing apparatus such as, for example, a sputtering apparatus, a CVD apparatus or an etching apparatus. The frequency of the high frequency waves output from the high frequency generating source 1 may be 13.56 MHz. However, high frequency waves with a frequency of, for example, 27.12 MHz or higher, or a low frequency of 400 kHz band may also be applied. An RF power in a range of, for example, several hundreds of watts to several tens of kilowatts may be used.

The controller 16 controls each element of the plasma processing apparatus. That is, the controller 16 controls the high frequency generating source 1, the matcher 2, the gas supply system 11, the APC 3, and the monitor device 12. Control conditions by the controller 16 may be input from an input device, and observation data of the sample 6 obtained from the monitor device 12 is displayed on a display device 18.

Next, a control performed by the controller 16 will be described.

Figure 2:
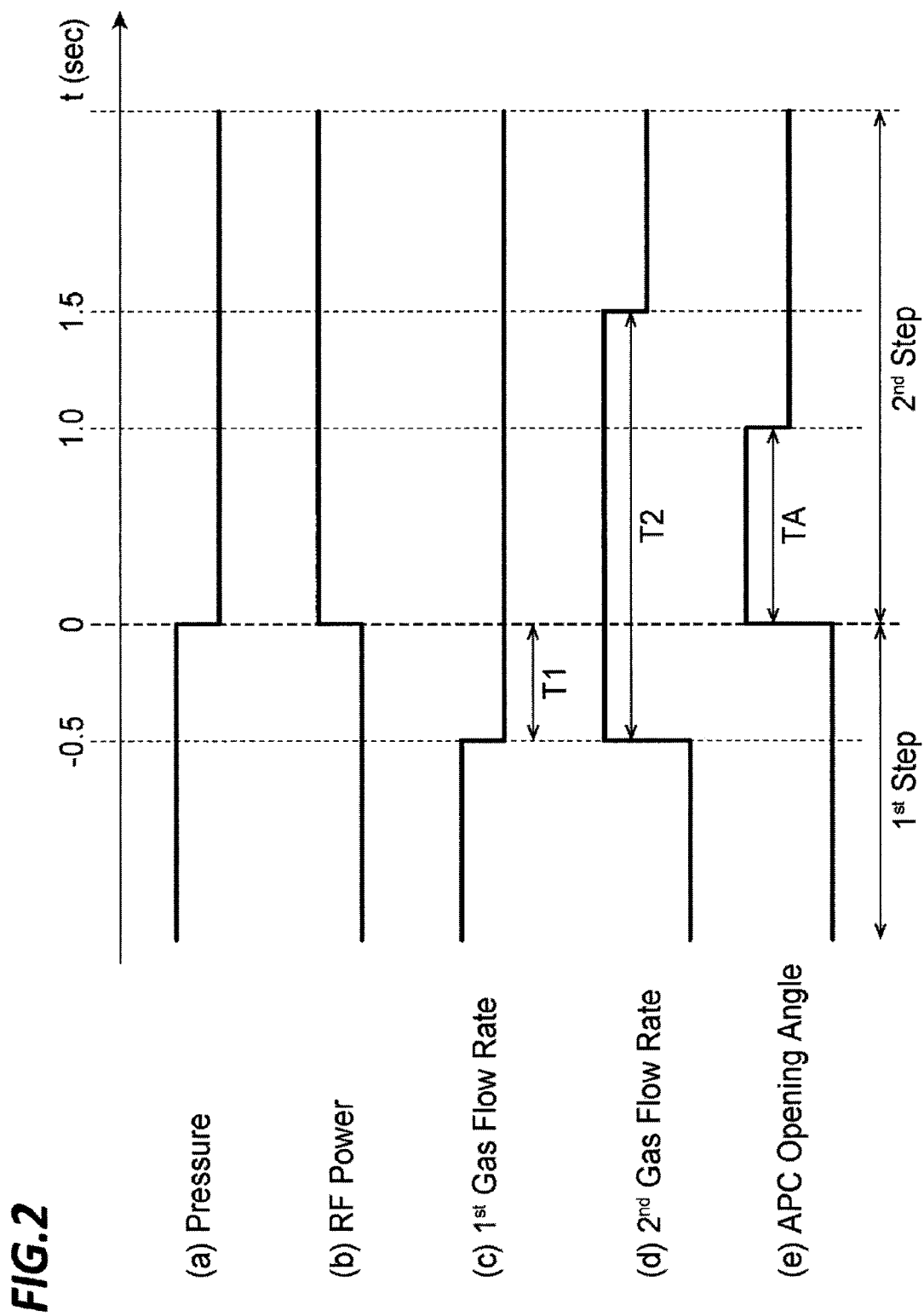
FIG. 2 illustrates a timing chart for use in design for various parameters.

FIG. 2 illustrates a timing chart for designing various parameters.

In the first step, the controller 16 drives the high frequency generating source 1 at a first energy condition, and in the second step, the controller 16 drives the high frequency generating source 1 at a second energy condition. The energy conditions are various depending on plasma processing conditions of the sample 6, and include the power (RF power) and frequency from the high frequency generating source 1.

In FIG. 2, it is assumed that the switching time of the first step and the second step is time t=0 sec. That is, it is assumed that the RF power is switched before and after t=0 sec, and in the present example, the RF power is increased. In the present example, the gas species supplied from the gas supply system 11 into the processing container 8 is switched from a first gas to a second gas earlier than the switching time t=0 (t=−0.5 sec). That, at time t=−0.5, the flow rate of the first gas is decreased (stopped), and the flow rate of the second gas is increased. The flow rate of the gas in the initial period T2 directly after the switching is set to be larger than the flow rate of the gas in the stabilization period after the lapse of the initial period T2 (after t=1.5 sec).

Here, the pressure within the processing container 8 is decreased by increasing the opening angle of the APC 3 during the period TA after time t=0. The period TA is included in the initial period T2. When the second gas is supplied earlier than time t=0 by the period T1, the period T1 in the present example is 0.5 sec (T1=0.5 sec), although the period T1 may be different depending on gas species or conditions. Upon considering the principle of the present disclosure, the effect of quick stabilization of plasma may be achieved even if the period T1 is longer or shorter than 0.5 sec. However, a range of 0.1 sec≤T1≤1.5 sec may be employed.

In addition, when the second gas is in the stabilization period after the lapse of the predetermined initial period T2, the flow rate of the second gas is decreased. In the initial period T2 in the present example is 2 sec (T2=2 sec), and upon considering the principle of the present disclosure, the effect of stabilization of plasma may be achieved even if the initial period T2 is longer or shorter than 2 sec. However, a range of 1 sec≤T2≤3 sec may be employed.

In the present example, the period TA is 1 sec (TA=1 sec), and upon considering the principle of the present disclosure, the effect of suppression of sudden fluctuation of the plasma may be achieved even if the period TA is longer or shorter than 1 sec. However, a range of 0.5 sec≤TA≤2 sec may be employed.

As described above, in the aforementioned plasma processing apparatus, by switching the gas species earlier than the energy condition switching time of the high frequency generating source 1 (t=0 sec) and further, increasing the flow rate of the gas, the gas of the first step within the processing container 8 may be quickly exhausted, the uniformity of the gas within the processing container 8 may be improved, the pressure of the gas may be stabilized, and the stabilization period of stabilizing the plasma (the period after lapse of the period T2) may be quickly achieved.

In addition, the plasma processing apparatus further includes the APC 3 configured to adjust the exhaust efficiency of the gas within the processing container 8, and the controller 16 controls the APC 3 to increase the exhaust efficiency within the processing container 8 in the initial period T2 to be higher than the exhaust efficiency of the gas in the stabilization period. As described above, when the gas flow rate greatly is increased earlier than the switching of energy conditions, the pressure within the processing container may be irregularly fluctuated. However, the fluctuation of the pressure can be suppressed by increasing the exhaust efficiency.

The aforementioned plasma processing method uses the plasma processing apparatus described above. The plasma processing method includes a first step of driving the high frequency generating source 1 at a first energy condition, and a second step of driving high frequency generating source 1 at a second energy condition. A gas species supplied from the gas supply system into the processing container is switched earlier than the switching time of the first step and the second step, the gas flow rate in the initial period T2 just after the switching is set to be larger than the gas flow rate in the stabilization period after the lapse of the initial period T2. The plasma processing method exhibits the same acting effects as the above-described plasma processing apparatus.

In addition, the plasma processing method increases the exhaust efficiency of the gas within the processing container 8 in the initial period T2 to be higher than the exhaust efficiency of the gas in the stabilization period after the initial period T2, thereby exhibiting the same acting effects as the above-described plasma processing apparatus.

Since the periods T1, T2, and TA described above are dependent on the volumes of a gas supply pipe, more specifically, the gas pipe from the gas supply source to the inside of the processing container where the plasma is generated, and the gas diffusion space, the periods T1, T2, and TA are not unchanged.

Hereinafter, actual examples will be described using FIGS. 3 to 7. In the timing charts, the horizontal axes represent time (sec). In the following description, periods of processing steps of original samples by gases A, B, C, and D will be indicated by A, B, C, and D in the timing charts. The period of the processing step of gas A represents a process of etching an anti-reflection film containing Si, the period of the processing step of gas B represents a process of etching amorphous carbon, the period of the processing step of gas C represents a process of etching silicon nitride, and the period of the processing step of gas D represents a process of etching a resist or dry cleaning of oxygen.

Gas A is $CF_4$, gas B is a mixed gas of $N_2$ and $O_2$, gas C is a mixed gas of $C_4F_8$, Ar, and $O_2$, and gas D is $O_2$. Gas C may be a mixed gas of $CHF_3$, Ar, $O_2$, and $F_4$.

Figure 3:
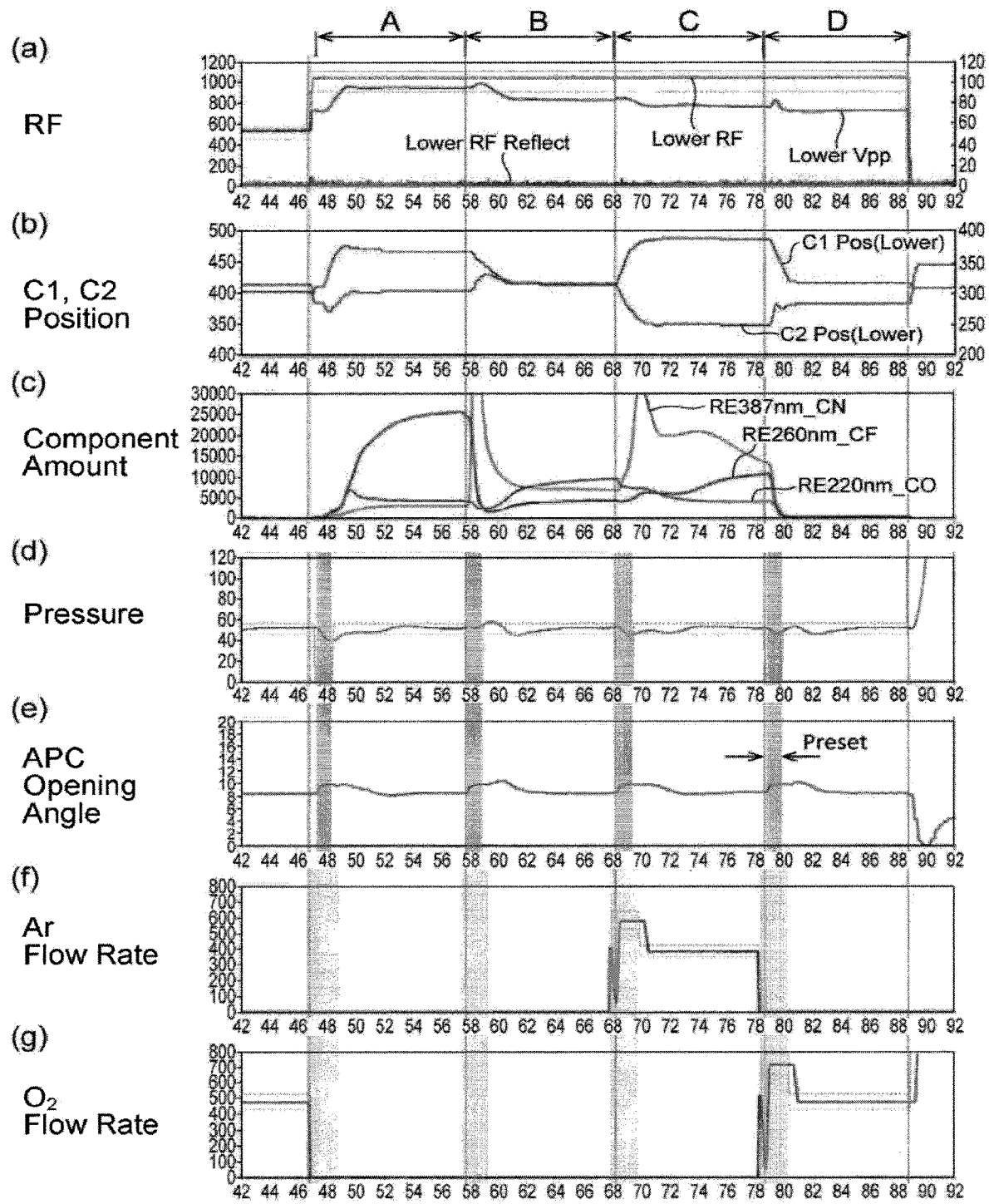
FIG. 3 illustrates an actual timing chart for various parameters.

FIG. 3 illustrates an actual timing chart of various parameters, in which the horizontal axes represents time (sec).

The units of the left-hand vertical axis of (a) of FIG. 3 are watt (W) and volt (V), which represent high frequency power (Lower RF) and inter-peak difference voltage of high frequency voltage (Lower Vpp), respectively. The unit of the right-hand vertical axis is watt (W) that represents reflected power of high frequency power (Lower RF Reflect).

The left-hand and right-hand vertical axes of (b) of FIG. 3 represents scaled numerical values for a matching operation range of matching position of a matcher, which represent positions of the variable capacitors C1 and C2 (C1Pos (Lower), C2Pos(Lower)) used in the matcher 2, respectively.

The left-hand vertical axis of (c) of FIG. 3 represents scaled numerical values of light emission intensity (magnitude) detected by a spectroscopic analyzer, which represent a plurality of component-quantities included in the plasma. In the plasma, CN (wavelength 387 nm), CF (wavelength 260 nm), and CO (wavelength 220 nm) are included.

The unit of the left-hand vertical axis of (d) of FIG. 3 is mTorr, which represents pressure within the processing container.

The unit of the left-hand vertical axis of (e) of FIG. 3 is degree (°), which represents an opening angle (exhaust efficiency) of the APC.

The unit of the left-hand vertical axis of (f) of FIG. 3 is sccm, which represents flow rate of Ar. In addition, the unit of the left-hand vertical axis of (g) of FIG. 3 is sccm, which represents flow rate of $O_2$.

The method of FIG. 2 may be applied to any steps. In the present example, however, tests were performed in the state where the RF power was set to be constant. In addition, the exhaust efficiency of the APC is increased during the period TA from the switching time of each step. In the period just after the switching (Preset), however, the opening angle of the APC is set to a predetermined value, and then an automatic feedback control is performed such that the internal pressure becomes constant.

In addition, in the step of gas C, Ar is supplied prior to step switching, and the supply amount of Ar is continuously increased in the initial period and then decreased in the stabilization period after the initial period. Likewise, in the step of gas D, $O_2$ is supplied prior to step switching, and the supply amount of $O_2$ is continuously increased in the initial period and then decreased in the stabilization period after the initial period.

Figure 4:
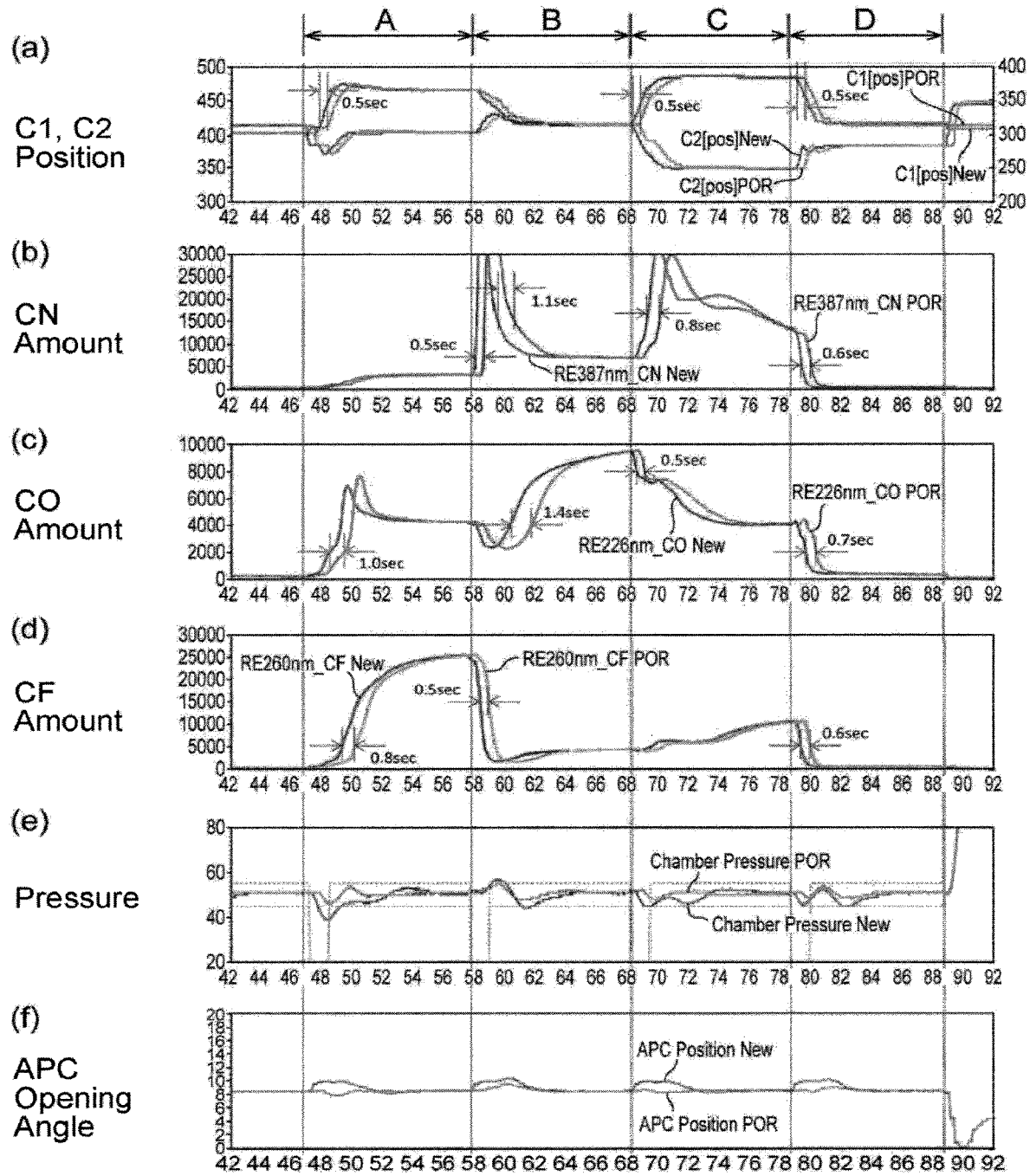
FIG. 4 illustrates an actual timing chart for various parameters.

FIG. 4 illustrates an actual timing chart of various parameters.

When the above-described control is performed, the period required for reaching the stabilization of the plasma is shortened. In addition, the period of adjusting the variable capacitors C1 and C2 that constitute the matcher is also shortened. Further, the variable capacitor C1 and C2 are automatically feedback-controlled in order to take impedance matching.

The left-hand vertical axis of (a) of FIG. 4 represents scaled numerical values for a matching operation range of matching position of a matcher, which represents a position of a variable capacitor C1 in an apparatus before improvement (C1[pos]POR) and a position of the variable capacitor C1 in the apparatus of the present disclosure after improvement (C1[pos]New), respectively. The right-hand vertical axis of (a) of FIG. 4 also represents scaled numerical values of a matching operation range of matching position of a matcher, which represent a position of a variable capacitor C2 in an apparatus before improvement (C2[pos]POR) and a position of the variable capacitor C2 in the apparatus of the present disclosure after improvement (C2[pos]New, respectively. Referring to (a) of FIG. 4, it can be seen that the time required for impedance matching is shortened by about 0.5 sec. In the apparatus before improvement, without performing pre-exhaust of the second gas, increase of flow rate of the second gas, and increase of the opening angle of the APC, the second gas is output by the same flow rate as that in the stabilization period simultaneously with step switching.

The left-hand vertical axis of (b) of FIG. 4 represents scaled numerical values of light emission intensity detected by a spectroscopic analyzer, which represent an amount of CN in plasma in the apparatus before improvement (RE387nm_CN POR) and an amount of CN in plasma in the apparatus after improvement (RE387nm_CN New). Before and after the improvement, it can be seen that CN is introduced into the processing container earlier by about 0.5 sec to 1.1 sec.

The left-hand vertical axis of (c) of FIG. 4 also represents scaled numerical values of light emission intensity detected by a spectroscopic analyzer, which indicate an amount of CO in plasma in the apparatus before improvement (RE226nm_CO POR) and an amount of CO in plasma in the apparatus after improvement (RE226nm_CO New). Before and after the improvement, CO is introduced into the processing container earlier by about 0.5 sec to 1.4 sec.

The left-hand vertical axis of (d) of FIG. 4 also represents scaled numerical values of light emission intensity detected by a spectroscopic analyzer, which indicate an amount of CF in plasma in the apparatus before improvement (RE260nm_CF POR) and an amount of CF in plasma in the apparatus after improvement (RE260nm_CF New), in as well. Before and after the improvement, CF is introduced into the processing container earlier by about 0.5 sec to 0.8 sec.

The unit of the left-hand vertical axis of (e) of FIG. 4 is mTorr, which represents pressure within the processing container in the apparatus before improvement (Chamber Pressure POR) and pressure within the processing container in the apparatus after improvement (Chamber Pressure New). The effects of the present disclosure are confirmed in a general process. In some cases, however, the effects of the present disclosure may not be obtained in, for example, gas flow rate or pressure setting.

The unit of the left-hand vertical axis of (f) of FIG. 4 is degree (°), which indicates an opening angle (exhaust efficiency). Just after step switching, the exhaust efficiency is increased.

As described above, in the above-described apparatus, while (1) pre-exhaust of the second gas, (2) increase of the flow rate of the second gas, (3) opening of the APC were performed, individual effects were confirmed.

Figure 5:
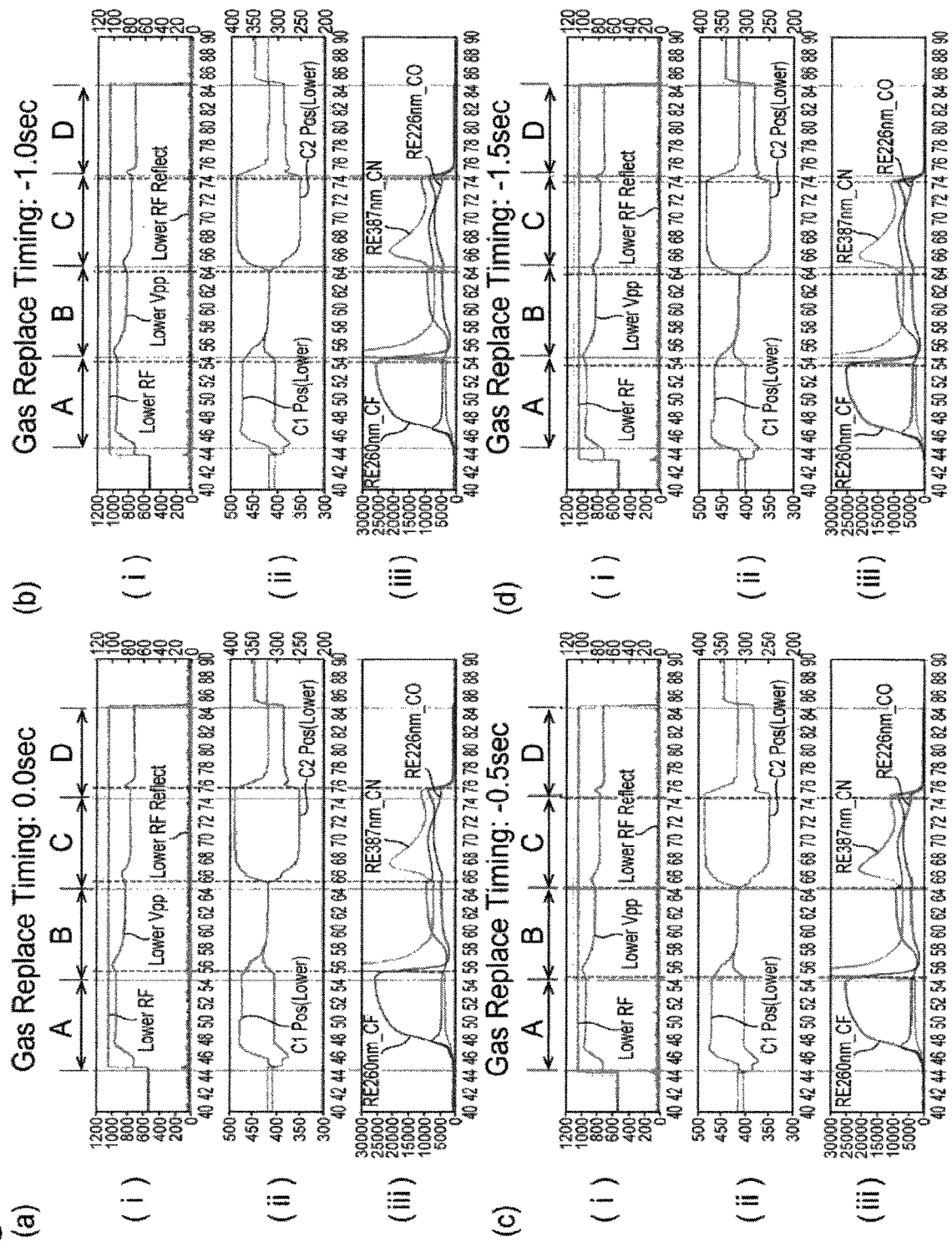
FIG. 5 illustrates actual timing charts for various parameters.

FIG. 5 illustrates an actual timing chart of various parameters for confirming the effect of pre-exhaust of the second gas.

(a) of FIG. 5 illustrates a case in which the second gas was introduced at time t=0, (b) of FIG. 5 illustrates a case in which the second gas was introduced at time t=−1.0 sec, (c) of FIG. 5 illustrates a case in which the second gas was introduced at time t=−0.5 is illustrated, and in (d) of FIG. 5 a case in which the second was introduced at time t=−1.5 sec.

Figure 6:
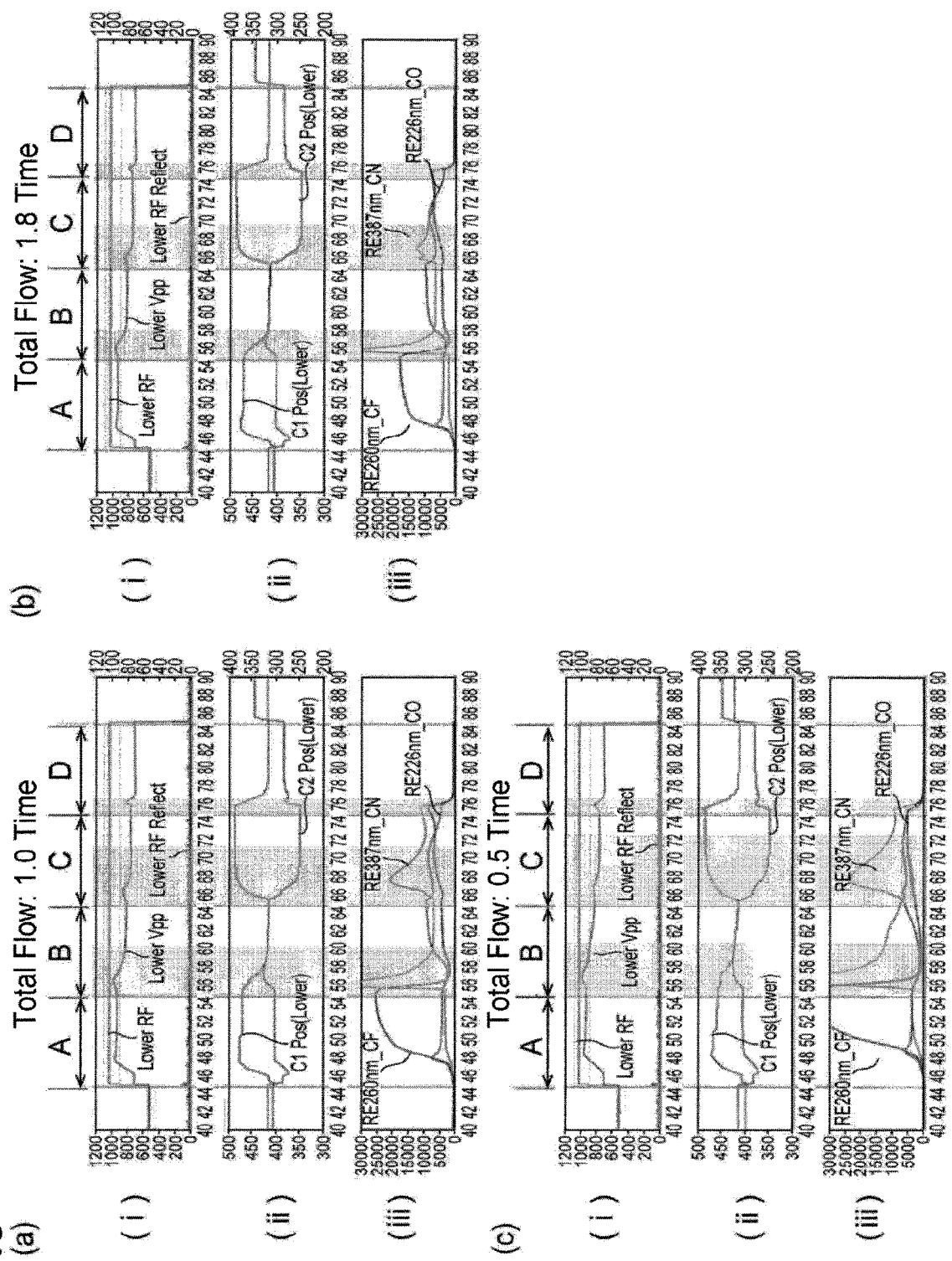
FIG. 6 illustrates actual timing charts for various parameters.

In addition, the units of the left-hand vertical axis of (i) in each of (a) to (d) of FIG. 5 and (a) to (c) of FIG. 6 are watt (W) and volt (V), which represent high frequency power (Lower RF) and inter-peak differential voltage of high frequency voltage (Lower Vpp). The unit of the right-hand vertical axis is watt (W), which represents reflected power of high frequency power (Lower RF Reflect). The left-hand and right-hand vertical axes of (ii) in each of (a) to (d) of FIG. 5 and (a) to (c) of FIG. 6 represents scaled numerical values of matching operation range of matching position of a matcher, which represent the positions of the variable capacitors C1 and C2 used in the matcher (C1Pos(Lower), C2Pos(Lower)), respectively. The left-hand vertical axis (iii) in each of (c) of FIG. 5 and (c) of FIG. 6 represents scaled numerical values of light emission intensity detected by a spectroscopic analyzer, which represents a plurality of component-quantities included in the plasma. In the plasma, CN (wavelength 387 nm), CF (wavelength 260 nm), and CO (wavelength 220 nm) are included.

From FIGS. 5 and 6, it can be seen that the pre-exhaust of the second gas shortens a delay until the stabilization period in the next step. In FIG. 5 and FIG. 6, however, it can be seen that the state of each of (c) of FIG. 5 and (c) of FIG. 6 is most properly shortened. In addition, in the tests of FIGS. 5 and 6, the opening angle of the APC was fixed to 8.5°.

In FIGS. 5 and 6, the flow rate of $CF_4$ which is gas A was set to 345 sccm, the flow rates of $N_2$ and $O_2$ included in gas B were set to 500 sccm and 20 sccm, respectively, the flow rates of $CHF_3$, Ar, $O_2$, and $CF_4$ included in gas C were set to 4.6 sccm, 385.7 sccm, 4 sccm, and 37.1 sccm, respectively, and the flow rate of $O_2$ which is gas D was set to 480 sccm.

In addition, in FIGS. 5 and 6, the pressure of all the processes was set to 50 mTorr (6.7 Pa), the RF power was set to 1000 W, and the ratio of the flow rate of the processing gas in the central area of the sample (FC) and the flow rate of the processing gas in the peripheral area of sample (FE) was set to 50 (RDC=FC/FE=50).

FIG. 6 illustrates actual timing charts of various parameters for confirming an effect of increase of flow rate of the second gas.

(a) of FIG. 6 illustrates a case in which the flow rate of the second gas was set to be equal to (1.0 time) the flow rate in the stabilization period in the second step, (b) of FIG. 6 illustrates a case in which the flow rate of the second gas was set to 1.8 times the flow rate in the stabilization period in the second step is illustrated, and (c) of FIG. 6 illustrates a case in which the flow rate of the second gas was set to 0.5 times the flow rate in the stabilization period in the second step.

From FIG. 6, it can be seen that the increase of flow rate of the second gas ((b) of FIG. 6) shortens the delay until the stabilization period in the next step.

Figure 7:
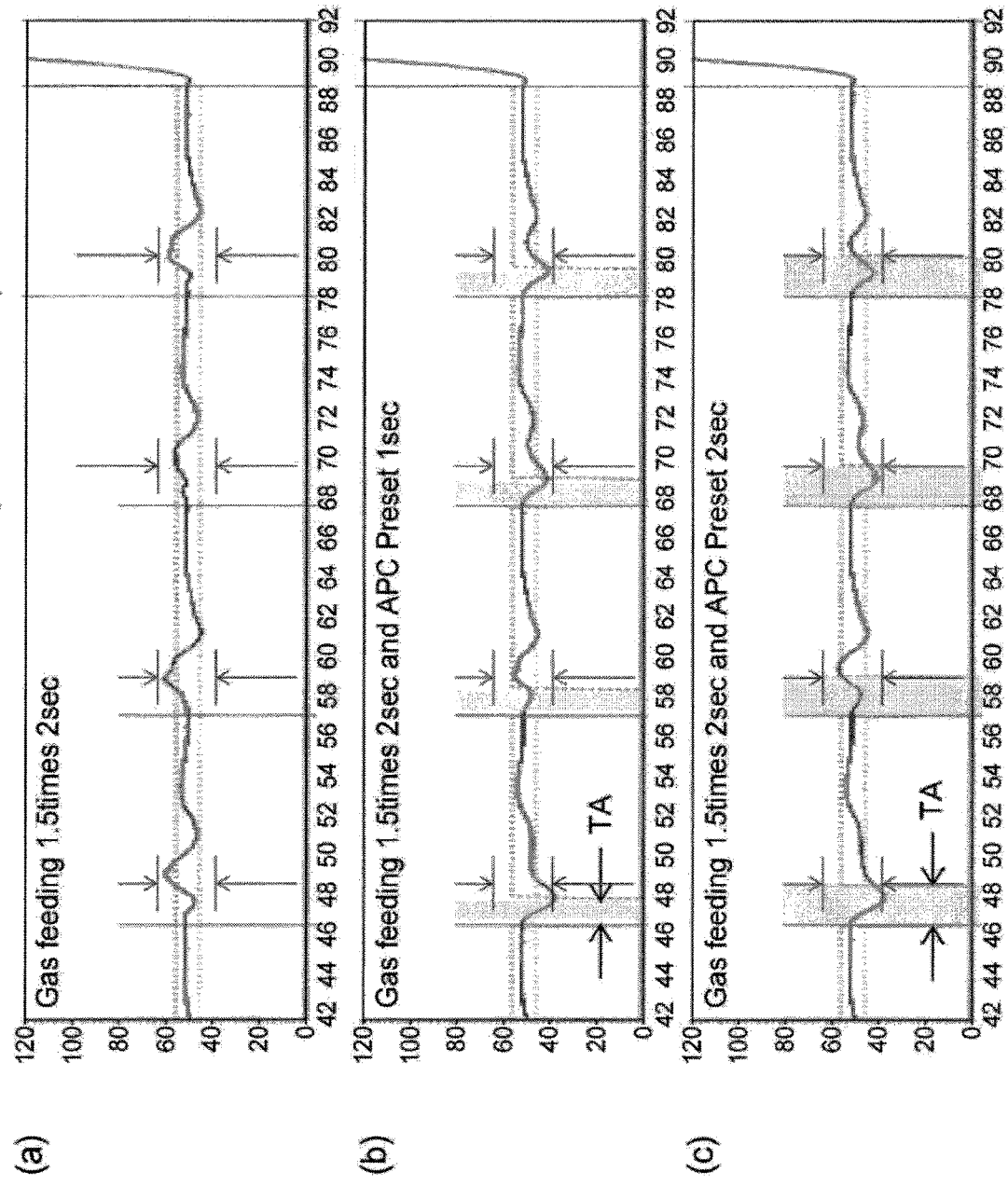
FIG. 7 illustrates timing charts for pressure.

FIG. 7 illustrates timing charts of pressure for confirming the opening of the APC, in which the horizontal axes represent time (sec), and the vertical axes represents pressure (mTorr).

(a) of FIG. 7 illustrates a case in which the flow rate of the second gas in the initial period was increased to 1.5 times and continued for 2 sec, and the opening angle of the APC was not increased, (b) of FIG. 7 illustrates a case in which the flow rate of the second gas in the initial period was increased to 1.5 times the flow rate in the stabilization period and continued for 2 sec, and the opening angle of the APC was increased during a preset period of TA=1 sec, and (c) of FIG. 7 illustrates a case in which the flow rate of the second gas in the initial period was set to 1.5 times the flow rate in the stabilization period and continued for 2 sec, and the opening angle of the APC was increased during a preset period of TA=2 sec. The other conditions were equal to those of FIG. 6.

The average pressures of (a), (b) and (c) of FIG. 7 were 11.5 mTorr, 10.7 mTorr, and 11.0 mTorr, and the condition of (b) of FIG. 7 was most easy to suppress the pressure fluctuation.

In addition, at the time of inter-step transition, continuous discharge (continuous plasma) is performed throughout each step. That is, each step transition is performed in the state where plasma is always generated. In this case, since the plasma sheath is not cut, the fall of particles to a sample such as, for example, a substrate or a wafer, may be suppressed so that mixing of particles to, for example, the sample can be suppressed.

In the exemplary embodiment described above, the gas transition state time at the time of transition from the plasma of the first step to the plasma of the second step may be shortened, and as a result, the time required for the plasma to reach the stabilization state may be shortened. The time required until the matcher automatically converges on a proper value, that is, the time required until the plasma is stabilized was improved by, for example, 30%. That is, since the plasma transition state in which the plasma processing quality becomes unstable, may be improved to be shortened, the plasma processing may be performed more precisely. Accordingly, even with a continuous discharge processing for reducing particles, it becomes possible to bring the plasma processing results closer to those obtained through an intermittent discharge processing in which each plasma processing is independently performed so as to maintain the plasma processing quality.

In addition, with respect to a plasma etching film in a device, it becomes possible to perform a plasma processing on the device more properly by providing a plasma processing improved in consideration of the gas delay by hardware.

Further, in the above-described exemplary embodiment, the plasma response speed at the time of transition is increased in the case where a sample is etched by different gases before and after the transition. Thus, the influence of a change in etching may be reduced and the processing precision for an etching (device) processing may be improved.

In addition, since the time required until the plasma is stabilized can be reduced, the throughput is improved. At the time of inter-step transition, in the case where the influence of continuous plasma is considerably great, the power for plasma generation during the inter-step transition is set to be very low as compared with those in the steps before and after the transition. In this case, the influence of the plasma is suppressed and excessive etching is suppressed in the transition period so that etching may be performed in a state where the plasma power is returned to the original power after the gas conditions within the processing container were completely shifted to the state of the next second step. In addition, when the method of the present disclosure is used, even the transition time at the low power as described above may be reduced, and the throughput may also be improved.

The above-described examples exhibit effects with respect to continuous plasma. However, when pre-exhaust of a gas is performed even in a conventional sequence other than the continuous plasma, the processing time may be shortened. Accordingly, according to the present disclosure, since the stabilization period in which the plasma is stabilized may be quickly achieved, a proper plasma processing may be performed.

Next, descriptions will be made on a method capable of shortening the period from the switching time of the first step and the second step to the time when the pressure within the processing container is stabilized. The following method is applicable to the exemplary embodiments described above. In addition, the plasma processing apparatus has a configuration as described above.

Figure 8:
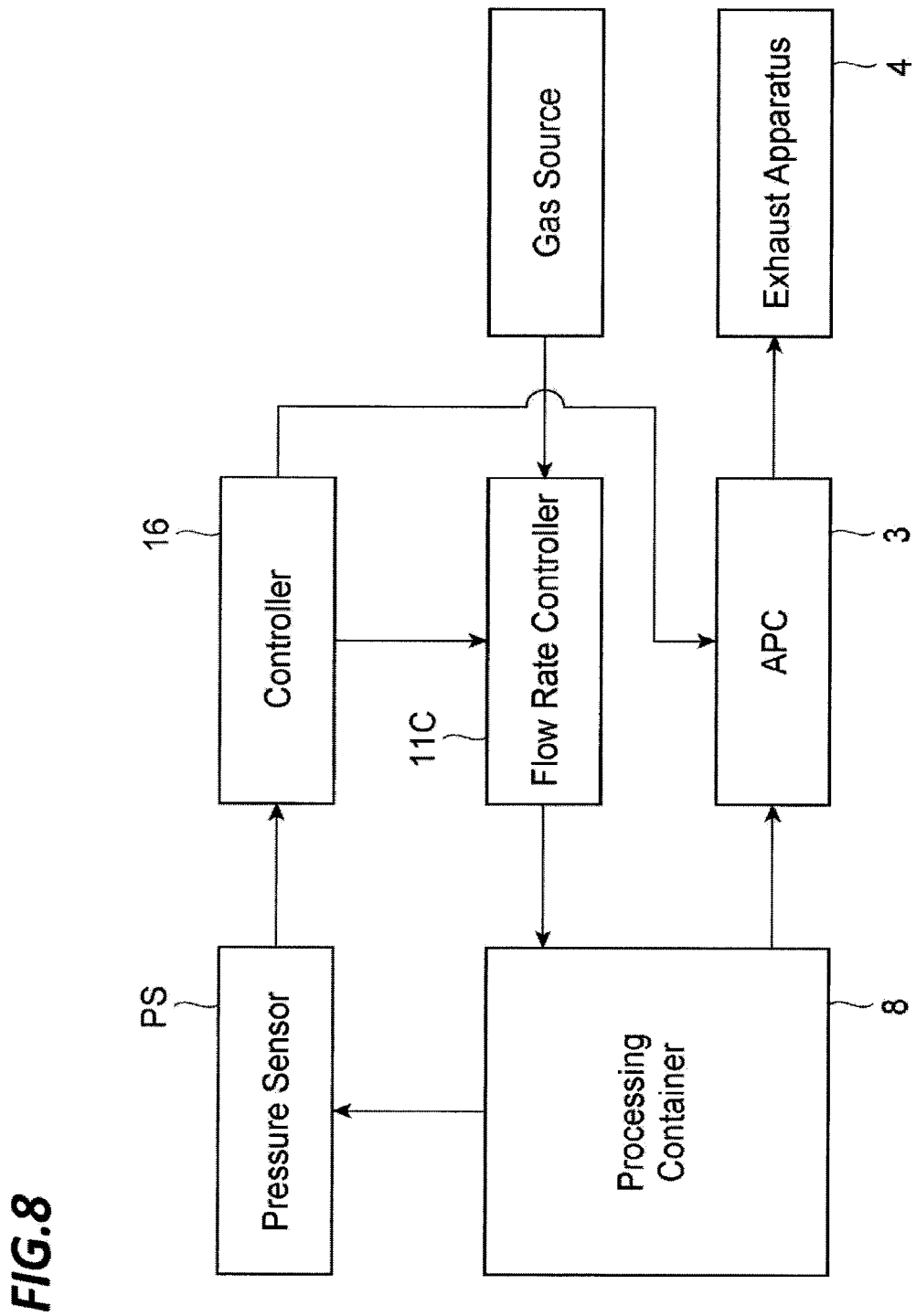
FIG. 8 illustrates a block diagram of a pressure control system in a plasma processing apparatus.

FIG. 8 is a block diagram of a pressure control system in the above-described plasma processing apparatus.

To the processing container 8, various gases are supplied from a gas source via a flow rate controller 11C. From the processing container 8, the gas within the processing container is exhausted by the exhaust apparatus 4 via the APC 3. In other words, the inlet quantity of gas per unit time is controlled by the flow rate controller 11C, and the outlet quantity of gas per unit time is controlled by the APC 3. The pressure within the processing container 8 is measured by the pressure sensor PS, and the measured pressure value is input to the controller 16.

In a conventional pressure stabilizing control, when making the pressure within the processing container 8 reach a target pressure P(TARGET), the controller 16 performs a feedback control. That is, assuming that the actual pressure value detected by the pressure sensor is P(REAL), the controller 16 calculates a deviation to the target, $\Delta P = P(TARGET) - P(REAL)$, and performs a control to automatically adjust the APC 3 such that the deviation $\Delta P$ becomes the minimum value. Assuming that the opening angle of the APC 3, in the case where $\Delta P$ is plus (pressure increase), the target opening angle of the APC 3, $\theta(TARGET)$, may be reduced in proportion to $1/\Delta P$ (proportional control). For example, the controller 16 performs a control, in which $\theta(TARGET) = \alpha \times (1/\Delta P)$ (here, $\alpha$ is a proper coefficient).

When an upper limit, $\Delta\theta(LIMIT)$, is set for a change amount of $\theta$ per unit time and $\theta$ is set to vary at every control cycle, $\theta$ is changed to the upper limit $\Delta\theta(LIMIT)$ at every control cycle in the case where $\Delta P$ is very large. However, in the feedback control based on the output from the pressure sensor PS, a control delay occurs and a control amount is in an overshoot state. That is, even if the opening angle $\theta$ had a value reaching the target pressure, the pressure within the processing container has not yet reached the target value, and thus, the calculated $\theta(TARGET)$ exhibits a value (downwardly) exceeding the target value. When the control is performed using the exceeding value as a target, an overshoot occurs and it takes time to obtain a desired pressure.

In an actual control, in addition to the proportional control described above, a PI control in which an integral control is added to the proportional control, or a PID control in which a differential control is added to the integral control, may be performed.

In the integral control, even in a case where the deviation ΔP is remarkably small and is limited in, for example, a set lower limit of the change amount of 0 so that θ is not changed and a residual deviation exists, θ is changed so as to remove the residual deviation when an integrated value of the deviation ΔP exceeds a predetermined value.

Further, when, for example, the integral control is performed, there is a problem in that it takes time to reach a target value. In the differential control, when the pressure deviation between the previous value and the present value is large, the target value is quickly achieved. Thus, the operation amount is increased with a certain overshoot.

When Kp, Ki, and Kd are set to proper coefficients, the angular operation amount of the APC 3 in a feedback control (PID control) is as follows.

Angular operation amount of APC=(proportional term)+(integral term)+(differential term)=$Kp$×accumulated value of deviation ΔP+$Ki$×accumulated value of deviation ΔP+$Kd$×difference from previous deviation.

When ΔP is minus (pressure decreasing), the target opening angle of the APC 3, θ(TARGET), may increase in proportion to |ΔP| (proportional control). For example, a control, in which θ(TARGET)=|α×ΔP|, is performed (here, α is a proper coefficient). Of course, even in this case, a PI control or a PID control is also enabled.

Here, when the plasma processing is switched from the first step to the second step, a pressure set value within the processing container and a pressure set value by the flow rate controller 11C are previously determined. Accordingly, the control of the pressure within the processing container is performed by the APC 3, but is intended to make the gas pressure quickly reach the target value to be stabilized by reducing the overshoot amount as much as possible.

With an investigation, it was found that a certain correlation exists between the conductance within the processing container (=set flow rate of gas/set pressure within processing container) and the opening angle of the APC 3 in the pressure stabilization state. Thus, it was determined to perform rapid pressure stabilization using this relationship for a control.

Figures 9A, 9B, 9C:
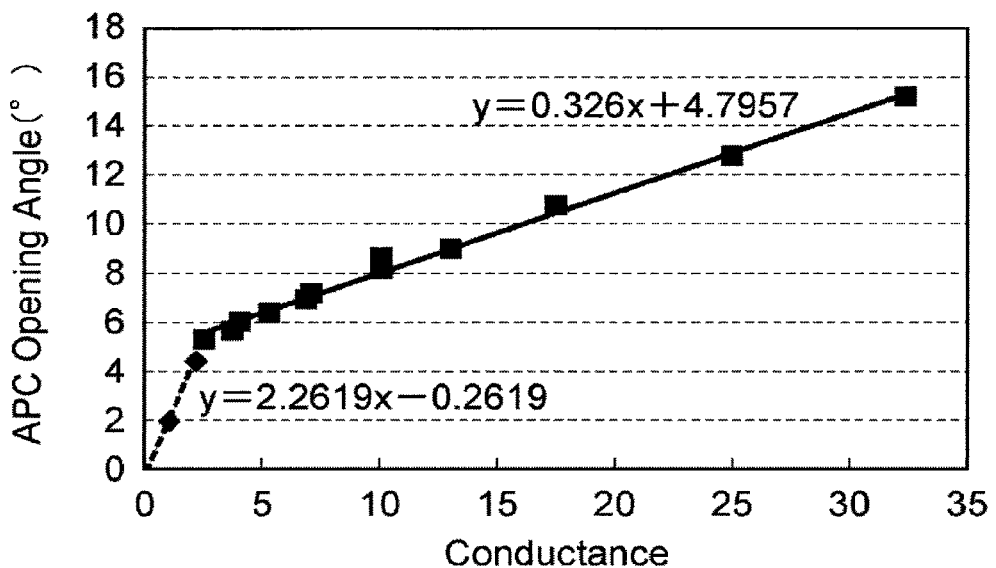
FIG. 9A illustrates a graph representing a relationship between conductance (sccm/mTorr) and APC opening angle (°)
FIG. 9B illustrates a table representing a relationship of APC opening angle according to pressure (mTorr) and flow rate (sccm)
FIG. 9C illustrates a table representing a relationship of conductance (sccm/mTorr) according to pressure (mTorr) and flow rate (sccm).

FIG. 9A is a graph representing a relationship between conductance (sccm/mTorr) and APC opening angle (°), FIG. 9B is a table representing a relationship of APC opening angle (°) according to pressure (mTorr) and flow rate (sccm), and FIG. 9C is a table representing a relationship of conductance (sccm/mTorr) according to pressure (mTorr) and flow rate (sccm).

That is, when the conductance increases, the opening angle of the APC 3 increases in proportion thereto. Assuming that the conductance (sccm/mTorr) is x and the opening angle (°) of the APC is y, a relationship of a linear function, y=ax+b, is established. In the present evaluation, when the conductance is 3 or more, a=0.326 and b=4.7957, and when the conductance is less than 3, a=2.2619 and b=−0.2619. The gradient a and the intercept b may have an error of ±30%.

According to the above-described correlation, it may be understood that when the conductance which is a set value in the second step is known in a step prior to measuring the actual pressure, the target value of the opening angle of the APC is determined. That is, a rapid pressure change with a small overshoot is enabled by performing the control of the APC (feedforward control) while setting the opening angle of the APC estimated from the relationship of the above-mentioned graph as a target value, rather than performing the feedback of the output from the pressure sensor.

Figure 10A:
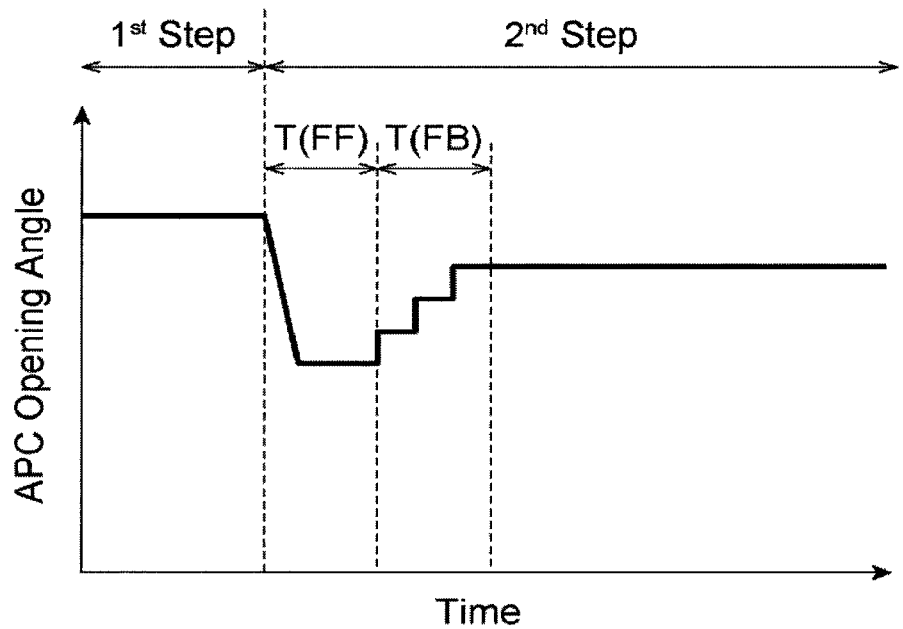
FIG. 10A illustrate a timing chart of APC opening angle according to an example.
Figure 10B:
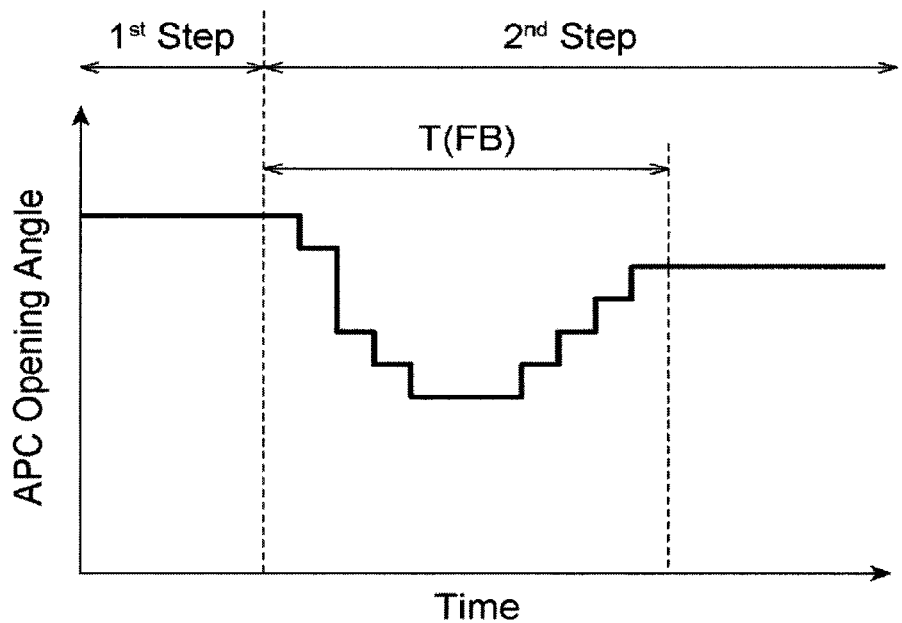
FIG. 10B illustrates a timing chart of APC opening angle according to a comparative example.

FIG. 10A is a timing chart of APC opening angle according to an example, and FIG. 10B is a timing chart of APC opening angle according to a comparative example. In the first step and the second step, plasma processing conditions are different. As described above, in the first step, the controller drives the high frequency generating source at the first energy condition, and in the second step, the controller drives the high frequency generating source at the second energy condition.

In the example, in the period T(FF) for switching from the first step to the second step, a feedforward control is performed on the actual opening angle θ of the APC such that the opening angle θ of the APC becomes the target value calculated from the above-described correlation, and in the period T(FB) thereafter, a feedback control is performed such that the actual pressure detected by the pressure sensor becomes the target pressure, thereby stabilizing the pressure within the processing container (the opening angle θ of the APC converges on a constant value).

In the present evaluation, the period T(FF) ranges from 0.1 sec to 2 sec.

The actual opening angle of the APC in the first step, θ($1^{st}$ STEP), the opening angle as the target value calculated from the above-mentioned correlation in the second step, θ(TARGET), and the change amount of the APC opening angle in one control cycle, θ(Δ), satisfy the following relationship.

Change amount θ(Δ)=θ($1^{ST}$ STEP)+opening angle θ(TARGET)−θ($1^{ST}$ STEP)×γ

Here, γ is a coefficient and, in the present evaluation, ranges from 0.5 to 2. When the value of γ is set to be larger than 1, the control elements of differential control become strong and an overshoot is caused. However, the opening angle θ of the APC may quickly reach the target value. After the opening angle θ of the APC exceeds the target value one time or after the lapse of a given period of 0.1 sec or more from the step switching, transition is carried out to the feedback control.

Meanwhile, in the comparative example in FIG. 10B, only the feedback control is used for adjusting the opening angle of the APC, and the time required until the pressure within the processing container is stabilized (until the APC opening angle θ converges on a constant value) is longer than that required in the example. In addition, since the control does not take the gas flow rate into consideration, the response to a pressure change caused by a change in gas flow rate is lowered.

The above-described inventions were verified using actual data.

Figure 11:
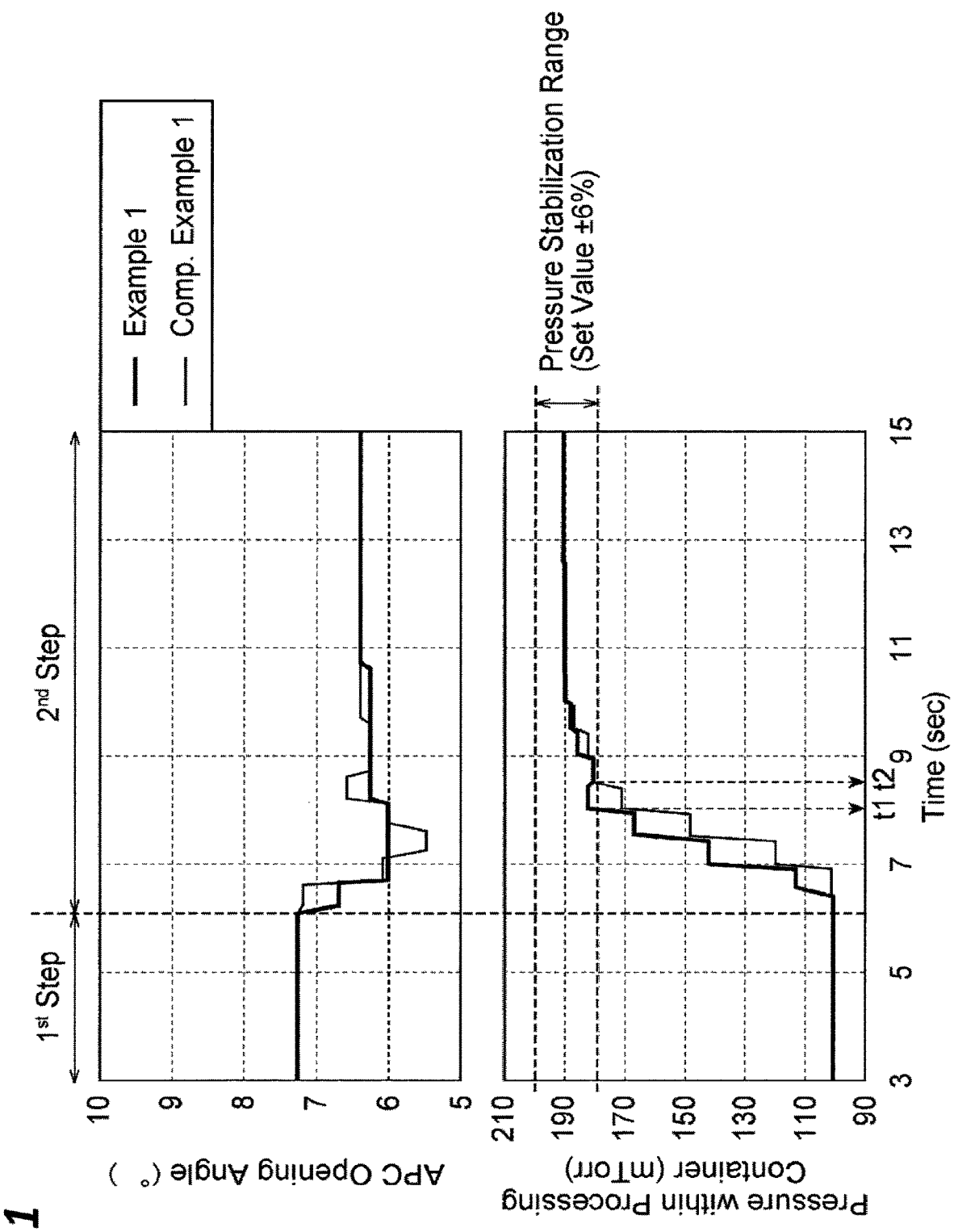
FIG. 11 illustrates graphs representing temporal changes of APC opening angle (°) and pressure (mTorr) within the processing container, according to Example 1 and Comparative Example 1.

FIG. 11 illustrates graphs representing temporal changes of APC opening angle (°) and pressure (mTorr) within the processing container according to Example 1 and Comparative Example 1. In the first step, the pressure within the processing container is 100 mTorr, and the flow rate of Ar supplied into the processing container from the gas source is 700 sccm. In the second step, the pressure within the processing container is 190 mTorr and the flow rate supplied into the processing container from the gas source is 1000 sccm.

In Example 1 and Comparative Example 1, when switching from the first step to the second step is carried out, the opening angle of the APC is reduced so that the pressure within the processing container is increased.

While the method of Example 1 performs an estimation control (FIG. 10A) using the above-mentioned correlation, the method of Comparative Example 1 performs a conventional feedback control (FIG. 10B). In the case where the target pressure in the second step was set to 190 mTorr, when the pressure within the processing container was stopped for one or more seconds within ±6% range thereof, it was determined that the pressure was stabilized and the time when the pressure reached first the range was calculated. In Example 1, the time was t1, and in Comparative Example 1, the time was t2. According to the obtained results, time t1 became earlier than time t2 about 0.6 seconds.

Figure 12:
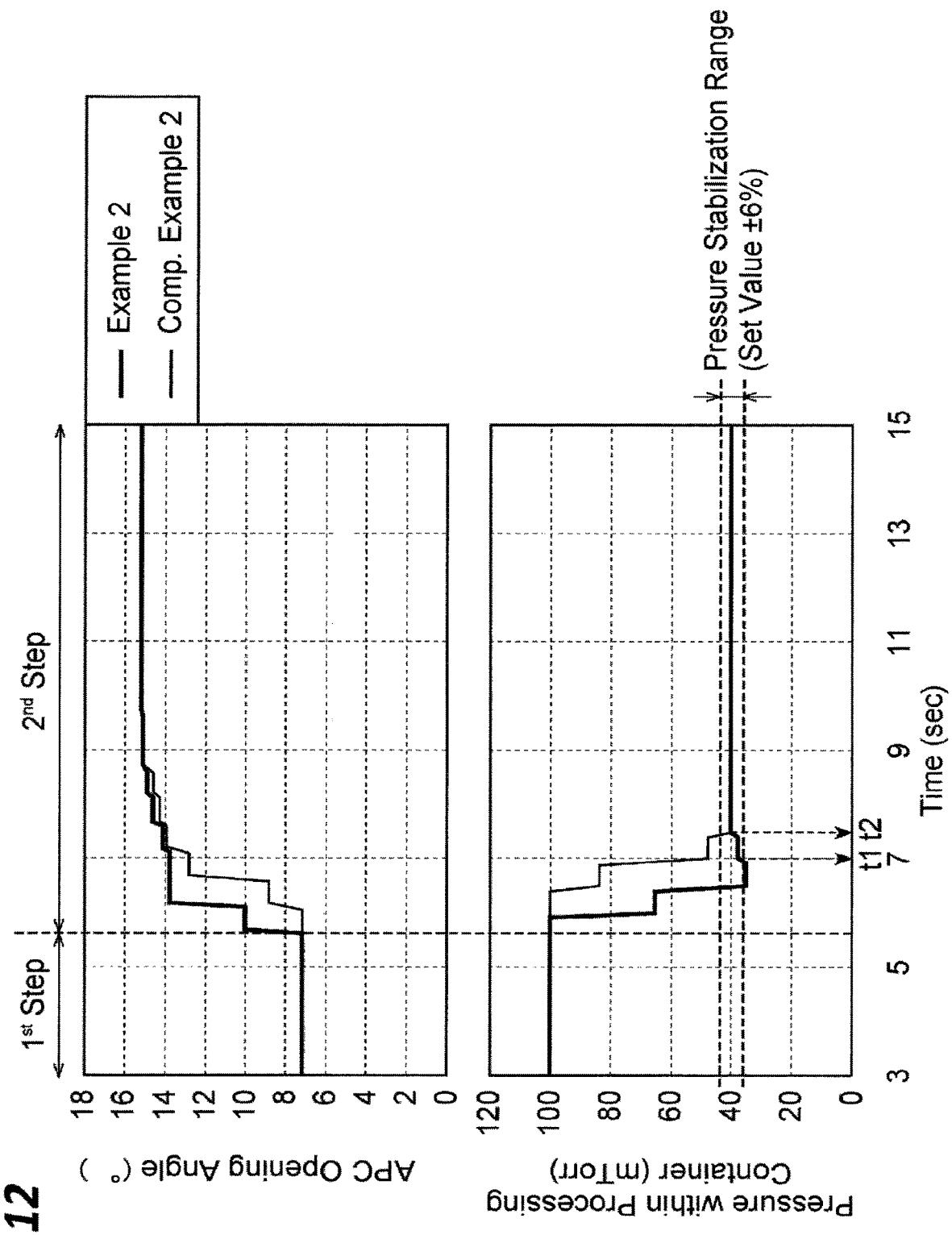
FIG. 12 illustrates graphs representing temporal changes of APC opening angle (°) and pressure within the processing container, according to Example 2 and Comparative Example 2.

FIG. 12 illustrates graphs representing temporal changes of APC opening angle (°) and pressure within a processing container according to Example 2 and Comparative Example 2.

In the first step, the pressure within the processing container is 100 mTorr, and the flow rate of Ar supplied into the processing container from the gas source is 700 sccm. In the second step, the pressure within the processing container is 40 mTorr, and the flow rate of Ar supplied from the gas source into the processing container is 1300 sccm.

In Example 2 and Comparative Example 2, when switching from the first step to the second step is carried out, the opening angle of the APC is increased such that the pressure within the processing container is reduced. In addition, the control is also applicable to the exemplary embodiment illustrated in FIGS. 1 to 7.

While the method of Example 2 performs an estimation control (FIG. 10A) using the above-mentioned correlation, the method of Comparative Example 2 performs a conventional feedback control (FIG. 10B). In the case where the target pressure in the second step was set to 40 mTorr, when the pressure within the processing container was stopped for one or more seconds within ±6% range thereof, it was determined that the pressure was stabilized and the time when the pressure reached first a value within the range was calculated. In Example 2, the time was t1, and in Comparative Example 1, the time was t2. According to the obtained results, time t1 became earlier than time t2 about 0.6 seconds.

As described above, the above-described plasma processing apparatus includes a processing container, a gas supply system configured to supply a gas into the processing container, a high frequency generating source configured to introduce high frequency waves for plasma generation into the processing container, an exhaust adjusting unit (APC) configured to adjust exhaust efficiency of the gas within the processing container, a controller configured to control the gas supply system and the exhaust efficiency adjusting unit. In the case where set pressures within the processing container in a first step and a second step executed within the processing container are different from each other, the controller sets, based on the set pressure within the processing container and the set flow rate of the gas supplied from the gas supply system in the second step, a target value of the exhaust efficiency of the exhaust efficiency adjusting unit which has a correlation with the values of the set pressure and the set flow rate, and controls the exhaust efficiency adjusting unit such that the actual exhaust efficiency becomes the target value of the exhaust efficiency.

Since the target value of the exhaust efficiency is calculated in advance based on the set pressure and the set flow rate having the correlation with the target value, it is possible to stabilize the pressure and plasma state within the processing container by making the pressure within processing container quickly coincide with the target value.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
a processing container;
a gas supply source configured to supply a gas into the processing container;
a high frequency generating source configured to introduce high frequency waves for plasma generation into the processing container; and
an exhaust efficiency adjuster including a valve configured to adjust an exhaust efficiency of the gas within the processing container;
a controller configured to control an overall operation of the gas supply source, the high frequency generating source, and the exhaust efficiency adjuster;
wherein the controller is configured to:
first drive the high frequency generating source at a first energy condition,
second drive the high frequency generating source at a second energy condition, at a switching time defined by a time when the first drive changes to the second drive,
switch, at a beginning of a predetermined period (T1) prior to the switching time, a gas species supplied from the gas supply source into the processing container,
set a gas flow rate for an initial period (T2) just after the switch to be larger than a gas flow rate for a stabilization period after lapse of the initial period, and
control the exhaust efficiency adjuster to increase the exhaust efficiency of the gas within the processing container to be higher during the initial period than the exhaust efficiency of the gas during the stabilization period, from a time when the predetermined period (T1) has elapsed after initiating the initial period to a time when the initial period ends.

2. The plasma processing apparatus of claim 1, wherein the predetermined period T1 is defined as 0.1 sec≤T1≤1.5 sec.

3. The plasma processing apparatus of claim 1, wherein a transitioning from the first drive to the second drive is performed without an intermediate time period.

* * * * *